(12) United States Patent
Zhang et al.

(10) Patent No.: US 7,511,361 B2
(45) Date of Patent: Mar. 31, 2009

(54) DFN SEMICONDUCTOR PACKAGE HAVING REDUCED ELECTRICAL RESISTANCE

(76) Inventors: Xiaotian Zhang, 4666 Cherrywood Dr., San Jose, CA (US) 95129; Kai Liu, 969 Reed Ave., Sunnyvale, CA (US) 94086; Ming Sun, 927C La Mesa Ter., Sunnyvale, CA (US) 94086

( * ) Notice: Subject to any disclaimer, the term of this patent is extended or adjusted under 35 U.S.C. 154(b) by 0 days.

(21) Appl. No.: 11/150,489

(22) Filed: Jun. 10, 2005

(65) Prior Publication Data
US 2006/0145318 A1 Jul. 6, 2006

Related U.S. Application Data

(63) Continuation-in-part of application No. 11/029,653, filed on Jan. 5, 2005.

(51) Int. Cl.
*H01L 23/495* (2006.01)

(52) U.S. Cl. ............... 257/666; 257/787; 257/E23.031

(58) Field of Classification Search ............... 257/666, 257/687, 787, E23.031
See application file for complete search history.

(56) References Cited

U.S. PATENT DOCUMENTS

2004/0004272 A1* 1/2004 Luo et al. ............... 257/666

* cited by examiner

*Primary Examiner*—Hoai v Pham
(74) *Attorney, Agent, or Firm*—Schein & Cai LLP

(57) ABSTRACT

A DFN semiconductor package is disclosed. The package includes a leadframe having a die bonding pad formed integrally with a drain lead, a source lead bonding area and a gate lead bonding area, the source lead bonding area and the gate lead bonding area being of increased area, a die coupled to the die bonding pad, a die source bonding area coupled to the source lead bonding area and a die gate bonding area coupled to the gate lead bonding area, and an encapsulant at least partially covering the die, drain lead, gate lead bonding area and source lead bonding area.

8 Claims, 9 Drawing Sheets

DFN SEMICONDUCTOR PACKAGE HAVING REDUCED ELECTRICAL RESISTANCE

CROSS REFERENCE TO RELATED APPLICATION

The present invention is a continuation in part application of commonly assigned Ser. No. 11/029,653, filed on Jan. 05, 2005 entitled "Dual Flat Non-Leaded Semiconductor Package", the disclosure of which is incorporated herein in its entirety.

BACKGROUND OF THE INVENTION

The present invention generally relates to semiconductor packages and more particularly to semiconductor packages and methods of making Dual Flat Non-Leaded (DFN) semiconductor packages having reduced electrical resistance and improved thermal properties.

Quad Flat Non-Leaded (QFN) semiconductor packages are well known in the art. QFN semiconductor packages are widely used in high pin out IC package applications. For example, a QFN semiconductor package is disclosed in U.S. Patent Application Publication 2002/0177254 entitled "Semiconductor Package and Method for Making the Same". The disclosed semiconductor package includes a plurality of connection pads and an embedded die. The connection pads at least partially enclose a die receiving area. An insulator is disposed in the die receiving area and the die is attached to the insulator. The die has a plurality of die bond pads. A plurality of connectors connect the die bond pads to respective connection pads. An encapsulant at least partially encapsulates the connection pads, insulator and die. The connection pads and insulator have exposed surfaces on an outer surface of the encapsulant. The exposed surfaces are substantially co-planar with the outer surface of the encapsulant. A resulting semiconductor package is shown in FIG. 1A and FIG. 1B.

It has been proposed to use DFN semiconductor packages in power MOSFET applications. In power MOSFET applications a major concern relates to thermal and electrical performance. The total electrical resistance Rds(on) of an electrical component includes chip resistance and package resistance. Chip resistance depends upon the wafer process technology used to fabricate the chip and die size while package resistance depends upon the quantity, diameter and length of bond wires used to bond internal chip bonding areas to external package leads. By increasing the amount of bond wires and/or their diameters, total Rds(on) can be reduced dramatically. QFN and DFN packages of the prior art suffer from the disadvantage of having high Rds(on).

A prior art 6×5 mm DFN package 700 is shown in FIG. 7. A leadframe 710 includes a narrow source bonding area 720 and a narrow gate bonding area 730. The narrow source bonding area 720 of DFN package 700 allows for only 11 narrow and short bonding wires 760 for connecting source leads 735 to a semiconductor die 750 and consequently does not provide reduced Rds(on).

There is therefore a need in the art for a DFN semiconductor package having improved electrical performance and thermal properties. Preferably such a DFN semiconductor package provides for reduced electrical resistance and inductance and improved thermal dissipation.

SUMMARY OF THE INVENTION

In accordance with one aspect of the invention, a DFN semiconductor package includes a leadframe having a die bonding pad formed integrally with a drain lead, a source lead bonding area and a gate lead bonding area, the source lead bonding area and the gate lead bonding area being of increased area, a die coupled to the die bonding pad, a die source bonding area coupled to the source lead bonding area and a die gate bonding area coupled to the gate lead bonding area, and an encapsulant at least partially covering the die, drain lead, gate lead bonding area and source lead bonding area In accordance with yet another aspect of the invention, a method of making a DFN semiconductor package includes the steps of forming a leadframe having a die bonding area with an integral drain lead, a gate lead bonding area and a source lead bonding area, the gate lead bonding area and a source lead bonding area being of increased area, bonding a die to the die bonding area, coupling a die source bonding area to the source lead bonding area, coupling a die gate bonding area to the gate lead bonding area, and encapsulating the die, the drain lead, the gate lead and the source lead.

In accordance with another aspect of the invention, a DFN common-drain die semiconductor package includes a leadframe having a die bonding pad formed integrally with a drain lead, first and second source lead bonding areas and first and second gate lead bonding areas, the first and source lead bonding areas and the first and second gate lead bonding areas being of increased area, a pair of common-drain die coupled to the die bonding pad, a first die source bonding area coupled to the first source lead bonding area, a second die source bonding area coupled to the second source lead bonding area, a first die gate bonding area coupled to the first gate lead bonding area, and a second die gate bonding area coupled to the second gate lead bonding area, and an encapsulant at least partially covering the pair of common-drain dies, drain lead, first and second gate lead bonding areas and first and second source lead bonding areas.

In accordance with another still aspect of the invention, a DFN common-drain die semiconductor package includes a leadframe having first and second die bonding pads formed integrally with first and second drain leads, first and second source lead bonding areas and first and second gate lead bonding areas, the first and source lead bonding areas and the first and second gate lead bonding areas being of increased area, a first common-drain die coupled to the first die bonding pad, a second common-drain die coupled to the second die bonding pad, a first die source bonding area coupled to the first source lead bonding area, a second die source bonding area coupled to the second source lead bonding area, a first die gate bonding area coupled to the first gate lead bonding area, and a second die gate bonding area coupled to the second gate lead bonding area, and an encapsulant at least partially covering the first and second common-drain dies, first and second drain leads, first and second gate lead bonding areas and first and second source lead bonding areas.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

These and other features, aspects and advantages of the present invention will become better understood with reference to the following drawings, description and claims.

DETAILED DESCRIPTION OF THE INVENTION

The present invention generally provides a power MOSFET DFN semiconductor package exhibiting improved electrical characteristics. An increased source bonding area provides for an increased number of source bonding wires having a 2 mil diameter. Improved thermal performance is also provided by an increased contact area between the encapsulant and the source bonding area and source bonding wires.

Figure 1A:
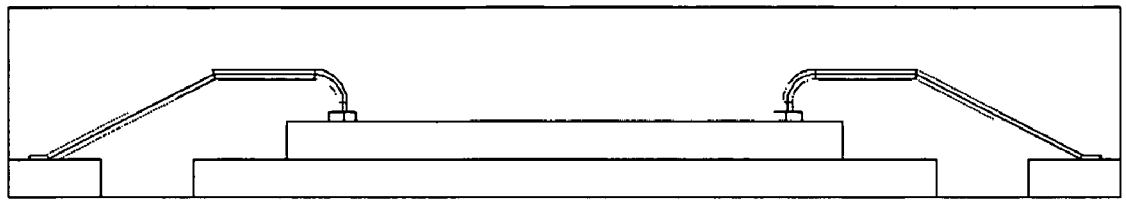
FIG. 1A is a cross sectional view of a semiconductor package of the prior art.
Figure 1B:
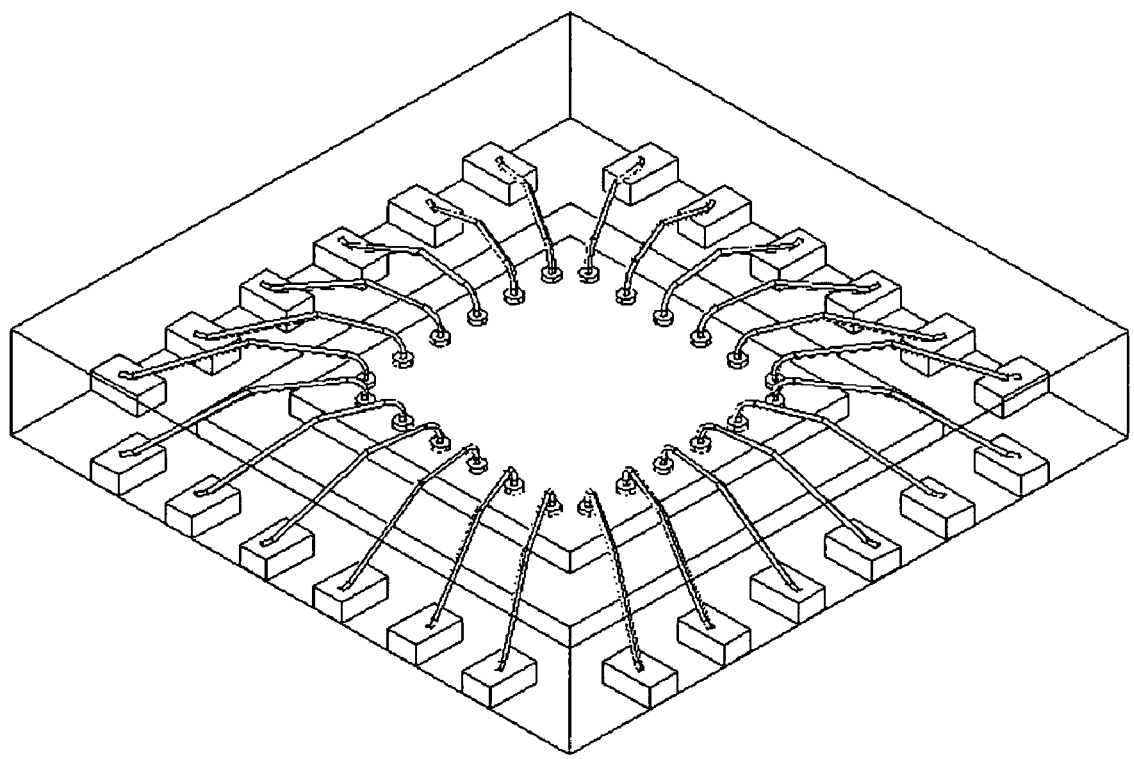
FIG. 1B is a perspective view of the semiconductor package of FIG. 1A.
Figure 2A:
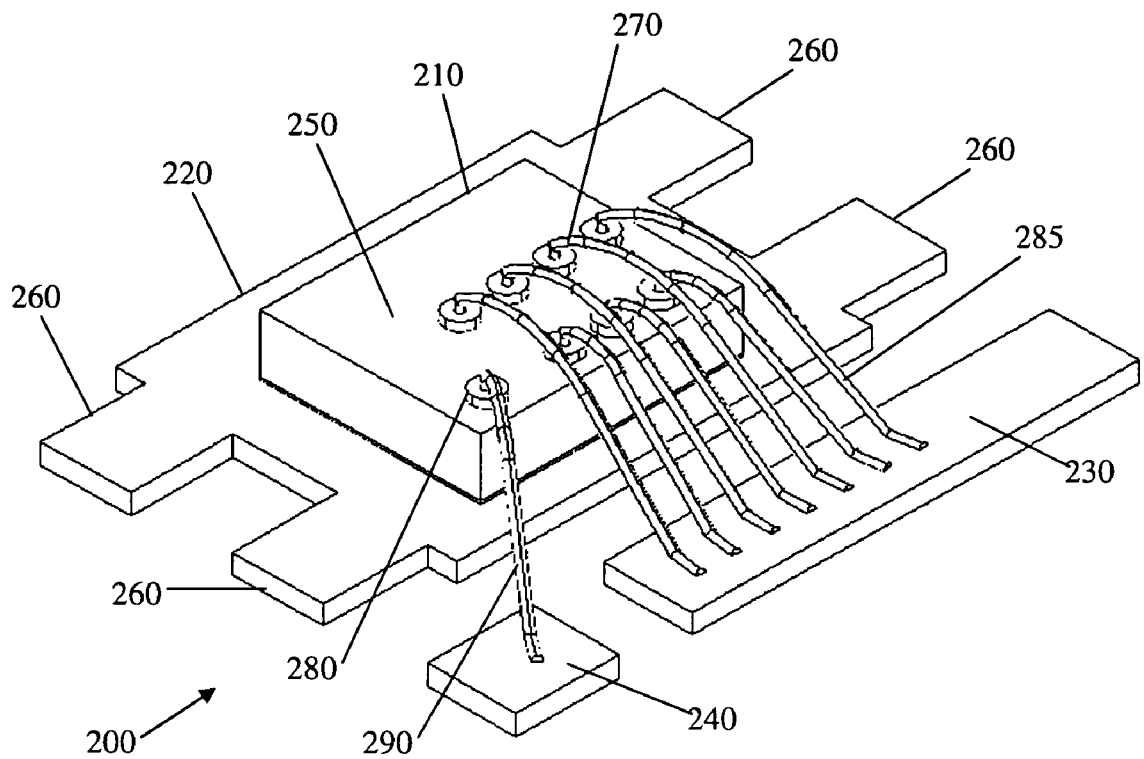
FIG. 2A is a perspective view of a leadframe for a single die package having a die attached and wire bonded thereto in accordance with the invention.
Figure 3A:
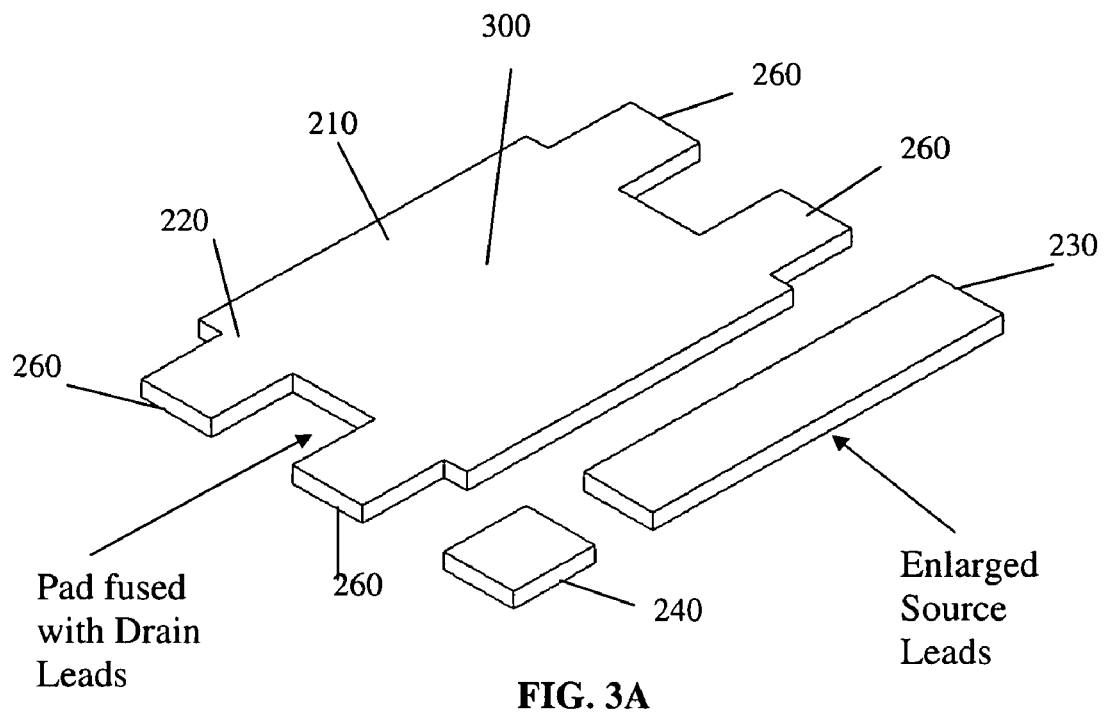
FIG. 3A is a schematic representation of a leadframe for a single die package in accordance with the invention.

In a first aspect of the invention and with reference to FIG. 2A, a DFN semiconductor package generally designated 200 may include a leadframe 210 fabricated of copper, aluminum, nickel or other good electrical and thermal conductive material. Leadframe 210 may be fabricated using metal plating or general manufacturing techniques. Leadframe 210 may include a drain portion 220 fused to drain leads 260, a source portion or lead 230 and a gate portion or lead 240. A power MOSFET die 250 may be attached to a die bonding pad 300 (FIG. 3A). Drain portion 220 may include four drain leads 260 to provide a six lead package.

Power MOSFET die 250 may include a patterned active area including a source bonding area 270 and a gate bonding area 280. A bottom portion of the power MOSFET die 250 (not shown) may include a drain bonding area.

With reference to FIG. 3A, the drain portion 220 includes the die bonding pad 300 integrally formed or fused with the drain leads 260. When the drain bonding area of the power MOSFET die 250 is attached to the die bonding pad 300 using a conductive epoxy or solder, and considering that the drain portion 220 includes an exposed bottom portion 720 (FIG. 2B), a thermal dissipation path is provided.

The source lead 230 (FIG. 2A) may be larger than in conventional semiconductor packages to enable the use of an increased number of source wires 285 which preferably are formed from gold or copper. Increasing the number of source wires 285 advantageously decreases the semiconductor package 200 resistance significantly. Additionally, as the DFN semiconductor package 200 has no external leads, the overall size of the package is reduced allowing for the use of shorter source lead 230, drain leads 260 and gate lead 240 thereby reducing package resistance and inductance.

Figure 5A:
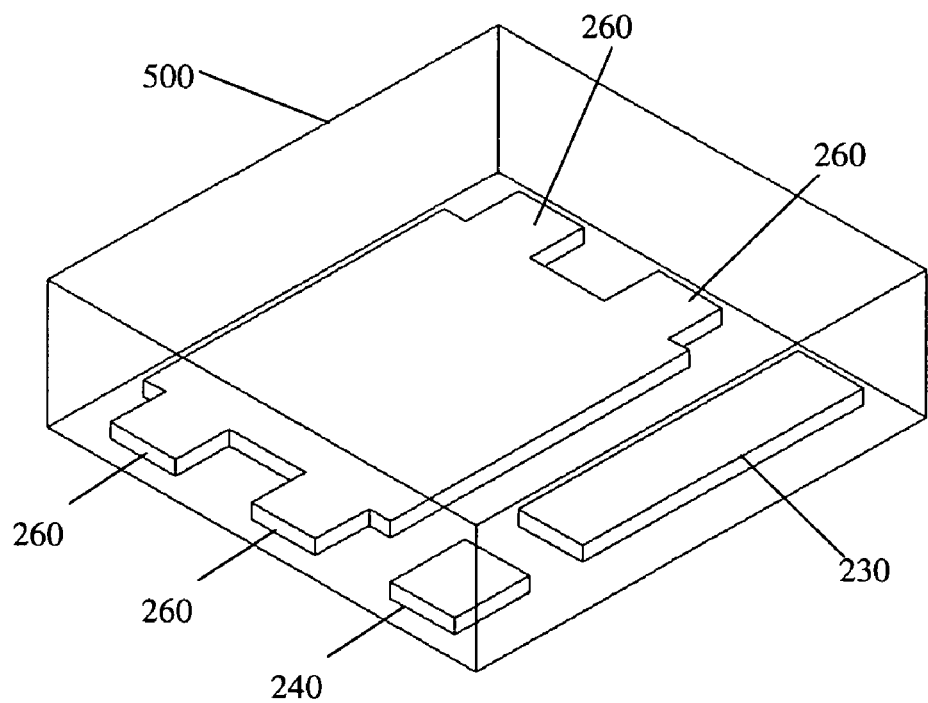
FIG. 5A is a schematic representation of a molded leadframe for a single die package in accordance with the invention.
Figure 5B:
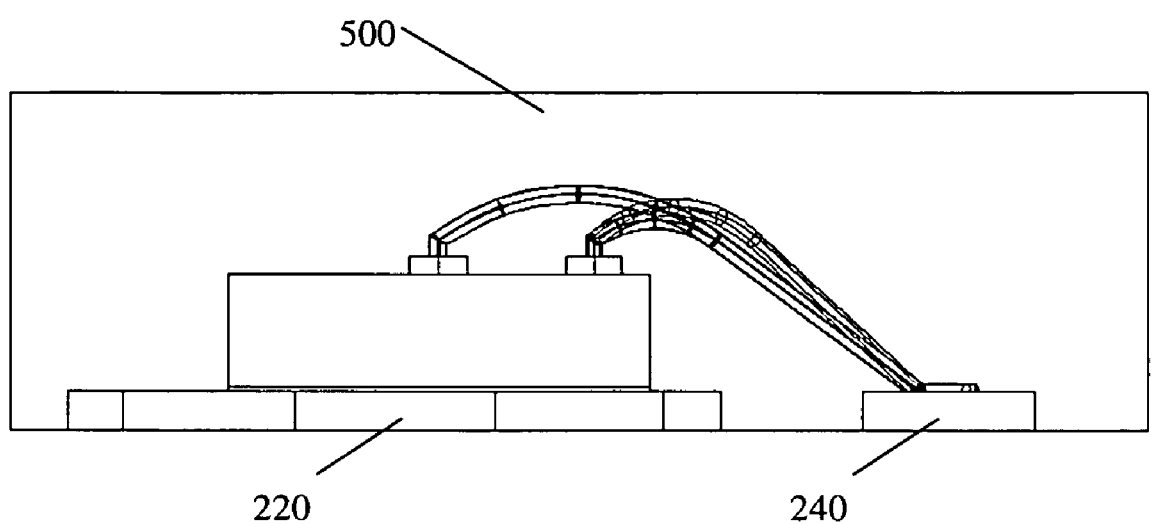
FIG. 5B is a cross sectional view of a power MOSFET package having the molded leadframe of FIG. 5A in accordance with the present invention.
Figure 6:
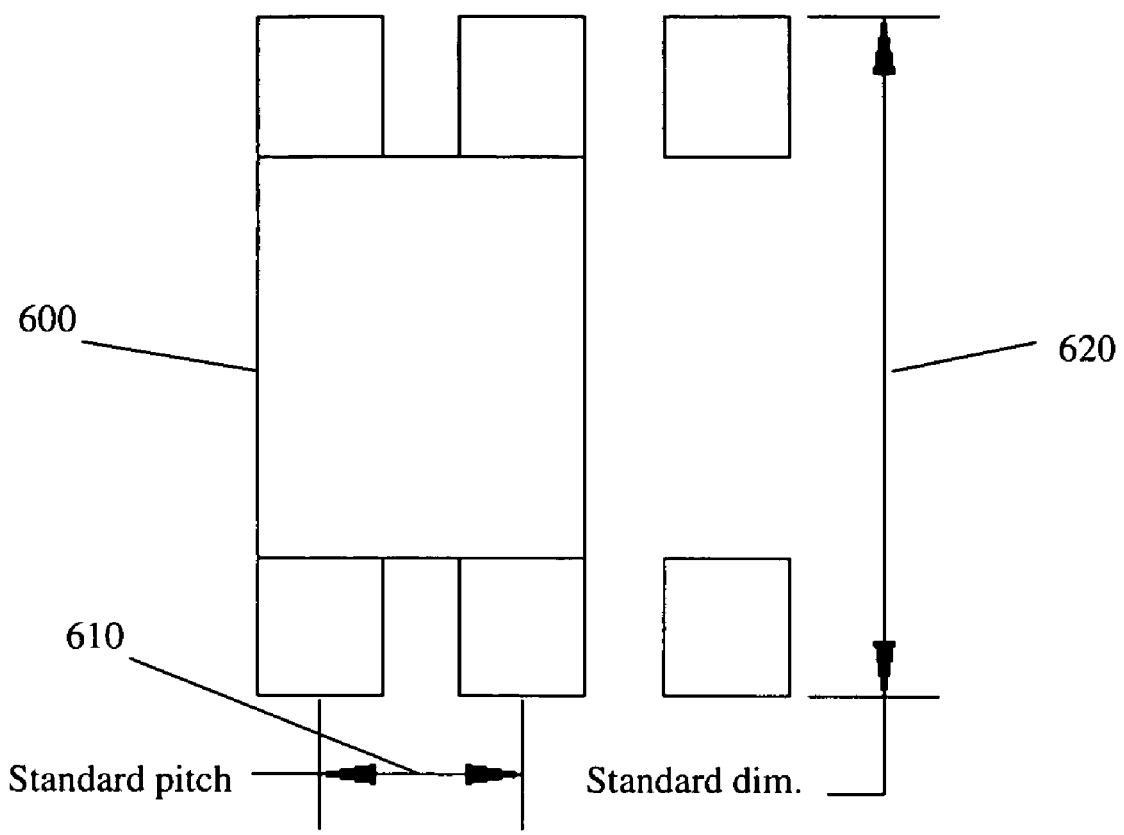
FIG. 6 is a plan view of a printed circuit board land pattern in accordance with the invention.
Figure 7:
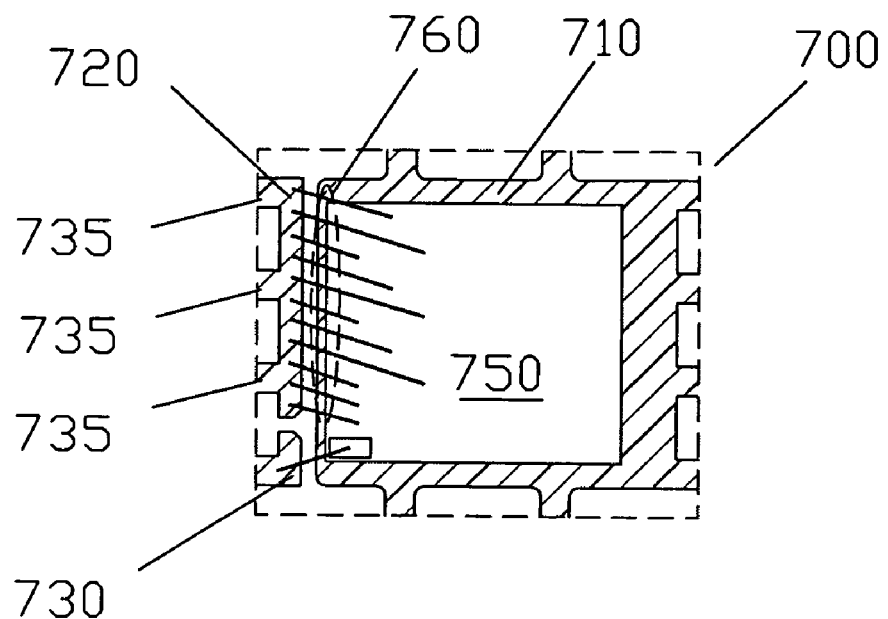
FIG. 7 is a schematic representation of a prior art 6×5 mm DFN semiconductor package.

The leadframe 210, power MOSFET die 250 and source wires 285 and gate wire 290 may be encapsulated by an encapsulant 500 formed of resin or other suitable material as shown in FIG. 5A and FIG. 5B. Drain leads 260, the gate lead 240 and the source lead 230 are shown disposed a distance internally of the encapsulant 500 edges. With reference to FIG. 6, a land pattern 600 for a PCB to which the DFN semiconductor package 200 may be mounted includes a standard pitch between drain lead mounting portions 610 and a standard dimension 620. Disposing the drain leads 260, the gate lead 240 and the source lead 230 a distance from an edge of the encapsulant 500 (FIG. 5A and FIG. 5B) provides for reduced short circuiting between devices and for higher device density.

Figure 2B:
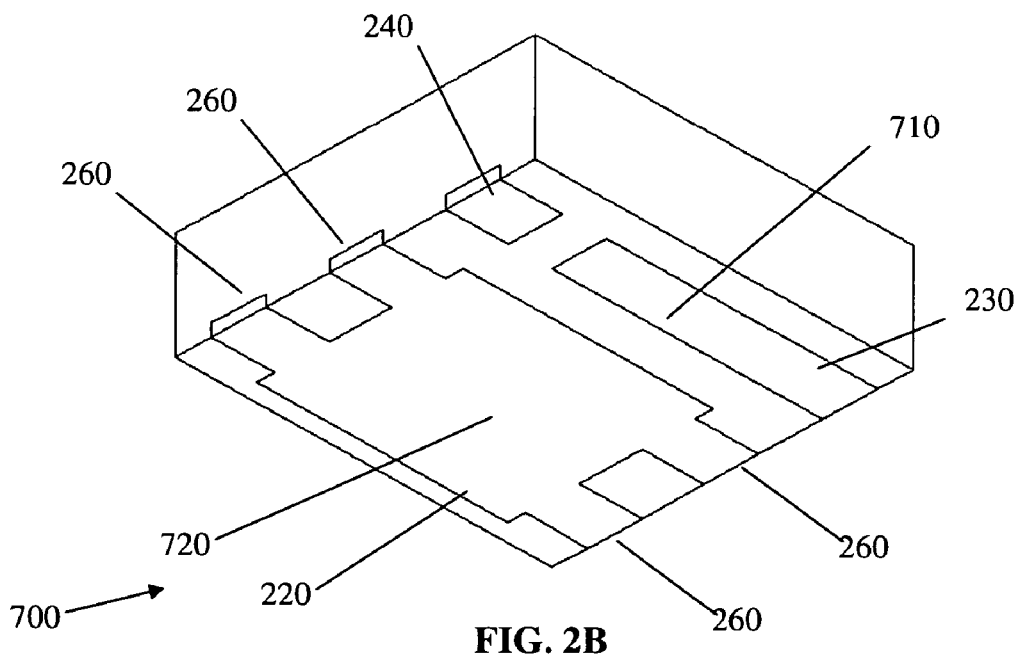
FIG. 2B is a bottom perspective view of a molded leadframe for a single die package in accordance with the invention.

In another aspect of the invention and with reference to FIG. 2B, a DFN semiconductor package generally designated 700 may include the source lead 230, the gate lead 240 and the drain leads 260 disposed at an edge of an encapsulant 710.

Figure 4:
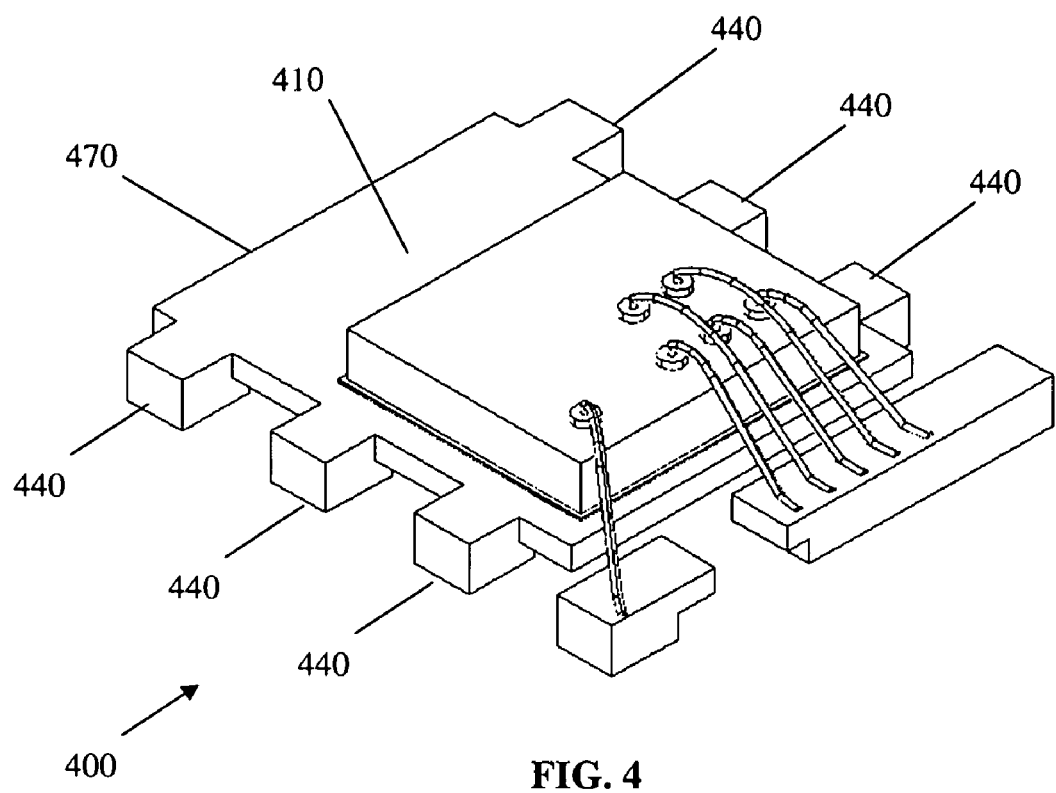
FIG. 4 is a perspective of an alternative embodiment of a leadframe for single die package having a die attached and wire bonded in accordance with the invention.

In another aspect of the invention and with reference to FIG. 4, a DFN semiconductor package generally designated 400 includes a leadframe 410 having an expanded drain portion 420. Expanded drain portion 420 provides for an eight lead DFN semiconductor package 400 having six drain leads 440.

Figure 3B:
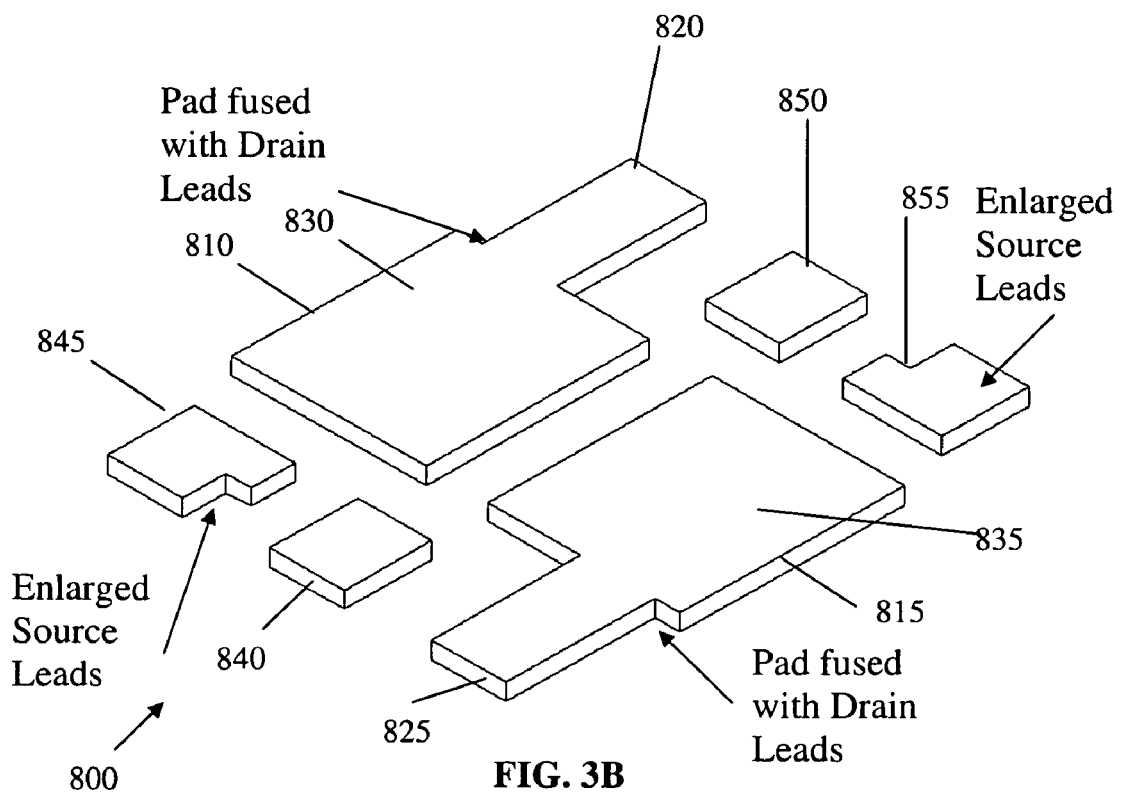
FIG. 3B is a schematic representation of a leadframe for a dual die in accordance with the invention.

In another aspect of the invention and with reference to FIG. 3B, a DFN semiconductor package generally designated 800 may include a first drain portion 810 and a second drain portion 815 having drain leads 820 and 825 respectively. First drain portion 810 may include a first die bonding pad 830 integrally formed with the drain lead 820 and the second drain portion 815 may include a second die bonding pad 835 integrally formed with the drain lead 825. First drain portion 810 may have associated therewith a first gate lead 840 and a first source lead 845. First source lead 845 may include an expanded surface area to accommodate more source bonding wires. Second drain portion 815 may have associated therewith a second gate lead 850 and a second source lead 855.

Second source lead 855 may include an expanded surface area to accommodate more source bonding wires. The first drain portion 810 and the second drain portion 815 may be fused together to provide a common drain device (not shown).

Figure 8:
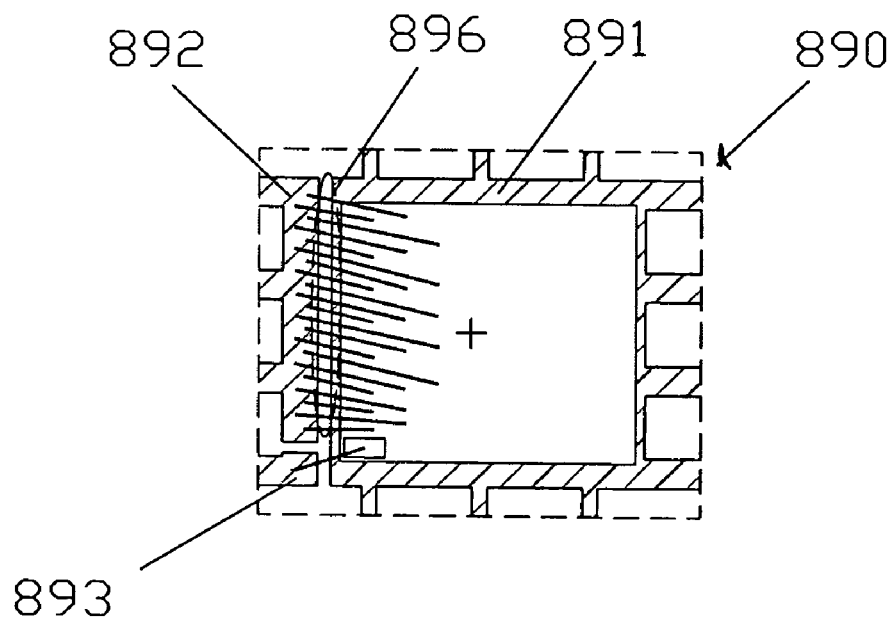
FIG. 8 is a schematic representation of a 6×5 mm DFN semiconductor package in accordance with the invention.

In yet another aspect of the invention, a 6×5 mm DFN semiconductor package generally designated 890 (FIG. 8) may include a leadframe 891 having a source bonding area 892 of increased area. A gate bonding area 893 may also be of an increased area. The source bonding area 892 allows for the use of 21 source bonding wires of 2 mil diameter rather than the conventional package which allows for the use of 11 source bonding wires.

Figure 9:
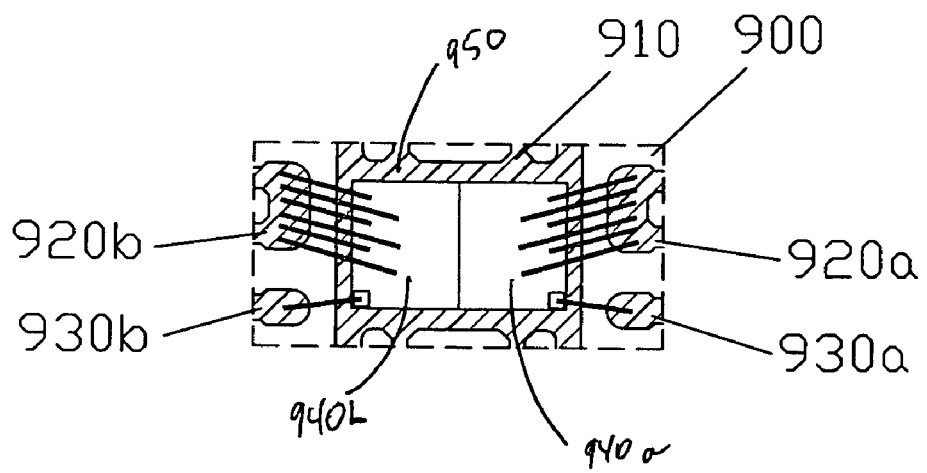
FIG. 9 is a schematic representation of a 2×4 mm DFN semiconductor package in accordance with the invention.

In another aspect of the invention, a 2×5 mm DFN semiconductor package generally designated 900 (FIG. 9) may include a leadframe 910 having a pair of source bonding areas 920*a* and 920*b* of increased area. Gate bonding areas 930*a* and 930*b* may also be of an increased area. Source bonding area 920*a* and gate bonding area 930*a* may be disposed along a first shorter length of the leadframe 910. Source bonding area 920*b* and gate bonding area 930*b* may be disposed along a second shorter length of the leadframe 910. Leadframe 910 may be used for a common-drain die package where the drains of two MOSFET devices 940*a* and 940*b* may be connected internally either through the semiconductor substrate or through the die bonding pad 950 of the leadframe 910. Source bonding area 920*a* may be connected to a source pad of a first MOSFET by wire bonding and source bonding area 920*b* may be connected to the source pad of a second MOSFET by wire bonding. Similarly, gate bonding area 930*a* and 930*b* may be connected to the gate bonding pads of first and second MOSFETs respectively by wire bonding.

Figure 10:
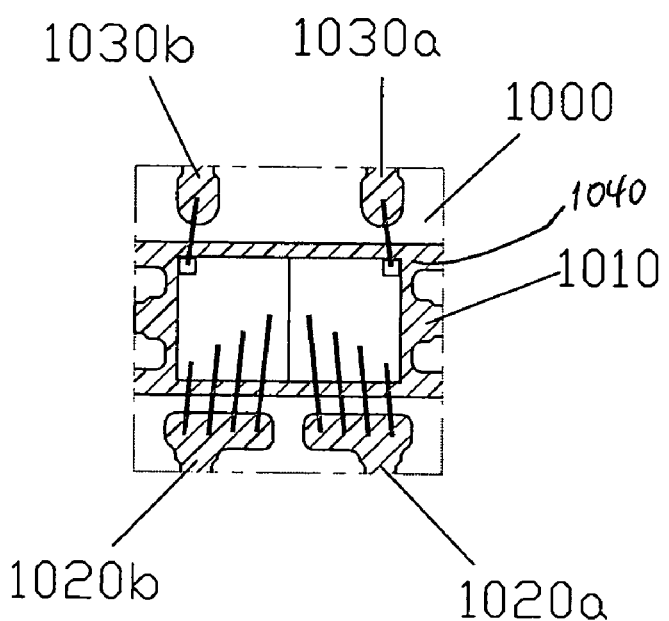
FIG. 10 is a schematic representation of a 3×3 mm DFN semiconductor package in accordance with the invention.

In yet another aspect of the invention and with reference to FIG. 10, a 3×3 mm DFN semiconductor package generally designated 1000 may include a leadframe 1010 having a pair of source bonding areas 1020*a* and 1020*b* of increased area. Gate bonding areas 1030*a* and 1030*b* may also be of an increased area. Source bonding areas 1020*a* and 1020*b* may be disposed along one side of the leadframe 1010 and gate bonding areas 1030*a* and 1030*b* may be disposed along an opposite side of the leadframe 1010. Leadframe 1010 may be used for a common-drain die package where the drains of two MOSFET devices may be connected internally either through the semiconductor substrate or through the die bonding pad 1040 of the leadframe 1010. Source bonding area 1020*a* may be connected to a source pad of a first MOSFET by wire bonding and source bonding area 1020*b* may be connected to the source pad of a second MOSFET by wire bonding. Similarly, gate bonding area 1030*a* and 1030*b* may be connected to the gate bonding pads of the first and second MOSFETs respectively by wire bonding.

Figure 11:
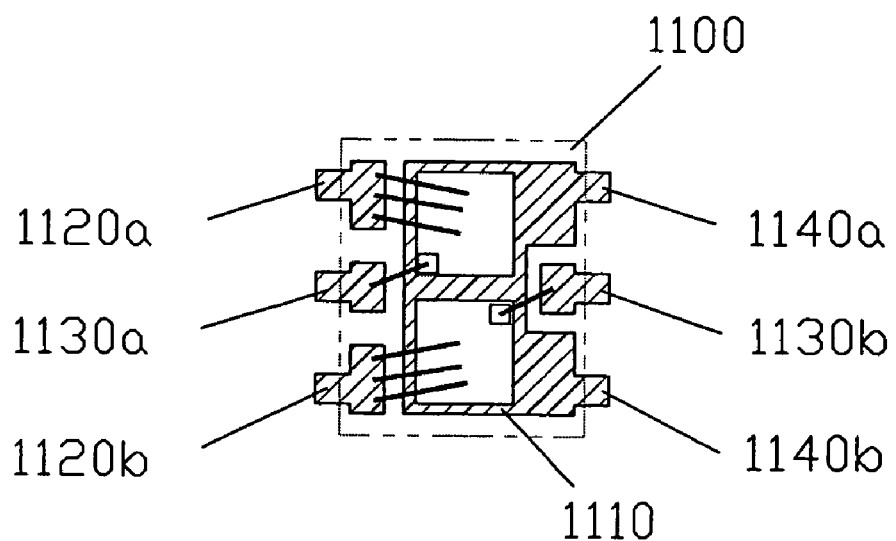
FIG. 11 is a schematic representation of another 3×3 mm DFN semiconductor package in accordance with the invention.

In another aspect of the invention and with reference to FIG. 11, a 3×3 mm DFN semiconductor package generally designated 1100 may include a leadframe 1110 having a pair of source bonding areas 1120*a* and 1120*b* of increased area. Gate bonding areas 1130*a* and 1130*b* may also be of an increased area. Source bonding areas 1120*a* and 1120*b* may be disposed along a first side of the leadframe 1110 on either side of the gate bonding area 1130*a*. Gate bonding area 1130*b* may be disposed along an opposite side. Leadframe 1110 may also include drain leads 1140*a* and 1140*b* disposed on the opposite side on either side of the gate bonding area 1130*b*. Leadframe 1110 may be used for a common-drain die package where the drains of two MOSFET devices are connected internally either through the semiconductor substrate or through the die bonding pad of the leadframe 1110. Source bonding area 1120*a* may be connected to a source pad of a first MOSFET by wire bonding and source bonding area 1120*b* may be connected to a source pad of a second MOSFET by wire bonding. Similarly, gate bonding area 1130*a* and 1130*b* may be connected to the gate bonding pads of first and second MOSFETs respectively by wire bonding.

Figure 12:
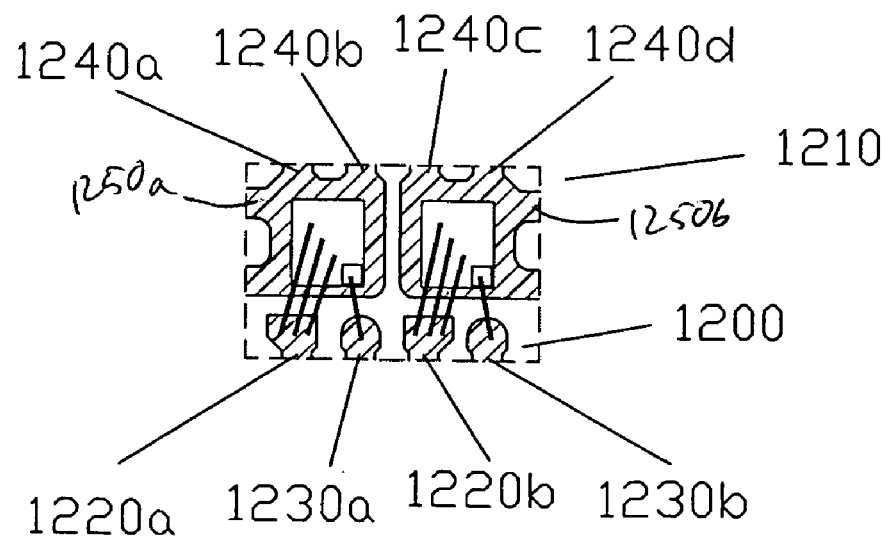
FIG. 12 is a schematic representation of a 2×3 mm DFN semiconductor package in accordance with the invention.

In yet another aspect of the invention and with reference to FIG. 12, a 2×3 mm DFN semiconductor package generally designated 1200 may include a leadframe 1210 having a pair of drain pads 1250*a* and 1250*b* and a pair of corresponding source bonding areas 1220*a* and 1220*b* of increased area. Gate bonding areas 1230*a* and 1230*b* may also be of an increased area. Leadframe 1210 may also include drain leads 1240*a* and 1240*b* fused to drain pad 1250*a* and drain leads 1240*c* and 1240*d* fused to drain pad 1250*b*. Source bonding areas 1220*a* and 1220*b* and gate bonding areas 1230*a* and 1230*b* may be disposed along a longer side of the leadframe 1210 while the drain leads 1240*a*, 1240*b*, 1240*c* and 1240*d* may be disposed along an opposite side of the leadframe 1210. Leadframe 1210 may be used for a common-drain die package where the drains of two MOSFET devices are connected internally either through the semiconductor substrate or through the die bonding pad of the leadframe 1210. Source bonding area 1220*a* may be connected to a source pad of a first MOSFET by wire bonding and source bonding area 1220*b* may be connected to a source pad of a second MOSFET by wire bonding. Similarly, gate bonding area 1230*a* and 1230*b* may be connected to the gate bonding pads of first and second MOSFETs respectively by wire bonding.

The DFN semiconductor package of the invention provides for a non-leaded semiconductor package having reduced resistance and inductance and improved thermal conductivity. By providing a source lead having an expanded surface area, an increased number of source wires may be used to reduce package resistance and inductance. Integrally forming the drain bonding pad with the drain leads provides a thermal dissipation path through the bottom of the DFN semiconductor package.

It should be understood, of course, that the foregoing relates to preferred embodiments of the invention and that modifications may be made without departing from the spirit and scope of the invention as set forth in the following claims.

We claim:

1. A dual flat non-leaded semiconductor package comprising:
    a leadframe having a die bonding pad formed integrally with a drain lead, a source lead bonding area and a gate lead bonding area, the source lead bonding area and the gate lead bonding area being of increased area;
    a die coupled to the die bonding pad, a die source bonding area coupled to the source lead bonding area and a die gate bonding area coupled to the gate lead bonding area; and
    an encapsulant at least partially covering the die, drain lead, gate lead bonding area and source lead bonding area to form the dual flat non-leaded semiconductor package.

2. The dual flat non-leaded semiconductor package according to claim 1, wherein the drain lead, the gate lead bonding area and the source lead bonding area are disposed a distance away from an edge of the encapsulant.

3. The dual flat non-leaded semiconductor package according to claim 2, wherein the drain lead, a gate lead and a source lead are disposed adjacent an edge of the encapsulant.

4. The dual flat non-leaded semiconductor package according to claim 1, wherein the drain lead, a gate lead and a source lead are exposed through the encapsulant from both an edge and a bottom surface of the encapsulant.

5. The dual flat non-leaded semiconductor package according to claim 1, wherein the leadframe is metal plated.

6. The dual flat non-leaded semiconductor package according to claim 1, wherein the leadframe comprises four drain leads.

7. The dual flat non-leaded semiconductor package according to claim 1, wherein the die is a MOSFET die.

8. The dual flat non-leaded semiconductor package according to claim 7, wherein the die is a common-drain MOSFET die.

* * * * *